(12) United States Patent
Kim et al.

(10) Patent No.: US 8,941,220 B2
(45) Date of Patent: Jan. 27, 2015

(54) POWER MODULE PACKAGE AND SYSTEM MODULE HAVING THE SAME

(75) Inventors: Kwang Soo Kim, Gyunggi-do (KR); Young Ki Lee, Gyunggi-do (KR); Seog Moon Choi, Gyunggi-do (KR); Sung Keun Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 51 days.

(21) Appl. No.: 13/484,160

(22) Filed: May 30, 2012

(65) Prior Publication Data

US 2012/0319260 A1 Dec. 20, 2012

(30) Foreign Application Priority Data

Jun. 17, 2011 (KR) ........................ 10-2011-0058920

(51) Int. Cl.
*H01L 23/495* (2006.01)
*H01L 23/433* (2006.01)
*H01L 23/498* (2006.01)
*H01L 23/31* (2006.01)
(Continued)

(52) U.S. Cl.
CPC ...... *H01L 23/4334* (2013.01); *H01L 23/49531* (2013.01); *H01L 23/49575* (2013.01); *H01L 23/49833* (2013.01); *H01L 2224/48091* (2013.01); *H01L 2924/13034* (2013.01); *H01L 23/3121* (2013.01); *H01L 24/16* (2013.01); *H01L 24/48* (2013.01); *H01L 25/0652* (2013.01); *H01L 25/0655* (2013.01); *H01L 2224/16227* (2013.01); *H01L 2224/48137* (2013.01); *H01L 2224/48227* (2013.01); *H01L 2224/48247* (2013.01); *H01L 2224/48463* (2013.01); *H01L 2224/4847* (2013.01); *H01L 2924/13055* (2013.01); *H01L 2924/13091* (2013.01); *H01L 2924/1815* (2013.01); *H01L 2924/19041* (2013.01); *H01L 2924/19043* (2013.01); *H01L 2924/19105* (2013.01); *H01L 2224/16225* (2013.01)
USPC ........... 257/676; 361/142; 361/752; 361/796; 257/678; 257/787

(58) Field of Classification Search
None
See application file for complete search history.

(56) References Cited

U.S. PATENT DOCUMENTS 5,199,895 A * 4/1993 Chang ........................... 439/326
5,530,623 A * 6/1996 Sanwo et al. .................. 361/788
(Continued)

FOREIGN PATENT DOCUMENTS

JP 07-058277 A 3/1995
JP 2003-179203 6/2003
(Continued)

OTHER PUBLICATIONS

Office Action dated Dec. 4, 2012 for related Korean Patent Application No. 10-2011-0058920 and its English summary.
(Continued)

*Primary Examiner* — Ori Nadav
*Assistant Examiner* — Ernest Allen, III
(74) *Attorney, Agent, or Firm* — Ladas & Parry, LLP (57) ABSTRACT

Disclosed herein is a power module package, including: a first substrate having first semiconductor chips mounted thereon; and a second substrate having second semiconductor chips mounted thereon, the second substrate being coupled with the first substrate such that a side surface in a thickness direction thereof is disposed on an upper surface of the first substrate.

13 Claims, 3 Drawing Sheets

(51) Int. Cl.
*H01L 23/00* (2006.01)
*H01L 25/065* (2006.01)

(56) References Cited

U.S. PATENT DOCUMENTS

| | | | | |
|---|---|---|---|---|
| 5,648,683 | A * | 7/1997 | Takahashi | 257/685 |
| 2003/0067065 | A1 * | 4/2003 | Lee et al. | 257/691 |
| 2007/0284947 | A1 * | 12/2007 | Lee et al. | 307/31 |
| 2010/0176498 | A1 * | 7/2010 | Lee et al. | 257/675 |
| 2011/0081797 | A1 * | 4/2011 | Chang | 439/327 |

FOREIGN PATENT DOCUMENTS

| | | |
|---|---|---|
| JP | 2010-124607 | 6/2010 |
| KR | 10-2003-0024157 A | 3/2003 |
| KR | 10-2006-0068854 A | 6/2006 |
| KR | 10-2008-0083533 | 9/2008 |
| KR | 10-1022906 | 3/2011 |

OTHER PUBLICATIONS

Office Action dated Jun. 20, 2012 for related KR App. No. 10-2011-0058920, and its English summary.

* cited by examiner

POWER MODULE PACKAGE AND SYSTEM MODULE HAVING THE SAME

CROSS REFERENCE TO RELATED APPLICATION

This application claims the benefit of Korean Patent Application No. 10-2011-0058920, filed on Jun. 17, 2011, entitled "Power Module Package and System Module Having the Same", which is hereby incorporated by reference in its entirety into this application.

BACKGROUND OF THE INVENTION

1. Technical Field

The present invention relates to a power module package and a system module having the same.

2. Description of the Related Art

As energy usage increases over the world, a great interest on the effective use of restricted energy has been taken. Therefore, the employment of inverters adopting an intelligent power module (IPM) for efficiently converting energy in the existing home and industrial appliances has been accelerated. As the application of this power module expands, marketing demands require products to have higher integration and smaller-size. Therefore, all-in-one power modules in which power devices and control devices are located in one module have emerged.

In general, the all-in-one power modules are classified into a structure in which power devices, such as IGBT and diodes, and control devices for controlling the driving of the power devices are bonded together on a lead frame, and then molded, a structure in which a lead frame is bonded on a ceramic substrate, and then power devices and control devices are bonded on the lead frame, and a structure in power devices and control devices are bonded on a direct bonding copper (DBC) substrate.

However, since the all-in-one power module according to the prior art, as described above, has power devices and control devices located in one module, the power devices and the control devices are not thermally separated from each other. As a result, it is highly likely to cause operation failure in the control devices that are thermally and electrically vulnerable, as compared with the power devices. In addition, when the operation failure occurs in the control devices, the module needs to be entirely replaced since only the control devices are not repairable or exchangeable, which may cause an increase in maintenance costs.

SUMMARY OF THE INVENTION

The present invention has been made in an effort to provide a power module package having a structure in which only a control device, which is thermally and electrically vulnerable as compared with a power device, is selectively exchangeable, and a system module having the same.

The present invention has also been made in an effort to provide a power module package having a three dimensional structure in which power devices and control devices are thermally separated from each other.

According to one preferred embodiment of the present invention, there is provided a power module package, including: a first substrate having first semiconductor chips mounted thereon; and a second substrate having second semiconductor chips mounted thereon, the second substrate being coupled with the first substrate such that a side surface in a thickness direction thereof is disposed on an upper surface of the first substrate.

The power module package may further include a coupling unit electrically connected to the first semiconductor chips and formed on the first substrate, the coupling unit having at least one coupling groove for coupling with the second substrate.

The coupling pin corresponding to the coupling groove may be formed on one end in a length direction of the second substrate.

Here, first catching protrusions facing each other may be formed on an upper portion of an inside of the coupling unit, and first catching grooves corresponding to the first catching protrusions may be formed in upper and lower portions of one end in a direction of the second substrate.

The power module package may further include a sealing resin having an insertion groove for exposing the coupling unit therethrough and wrapping the side surface and the upper surface of the first substrate.

Here, second catching protrusions facing each other may be formed on an upper portion of an inside of the insertion groove, and second catching grooves corresponding to the second catching protrusions may be formed in upper and lower portions of one end in the direction of the second substrate.

The power module package may further include a lead frame having one end having one end buried in the sealing resin and connected to the first substrate and the other end protruded out of the sealing resin.

The first semiconductor chip and the second semiconductor chip may be a power device and a control device, respectively.

The first substrate may be a metal substrate having an anodized layer, and the metal substrate may be made of aluminum (Al).

The second substrate may be a printed circuit board (PCB).

According to another preferred embodiment of the present invention, there is provided a system module, including: a power module package including a first substrate having first semiconductor chips mounted thereon, a second substrate having second semiconductor chips mounted thereon, the second substrate being coupled with the first substrate such that a side surface in a thickness direction thereof is disposed on an upper surface of the first substrate, and a lead frame having one end connected to the first substrate and the other end protruded to the outside; and a main board substrate coupled with the other end of the lead frame protruded to the outside to allow the power module package to be installed thereon, the main board substrate having a slot with a size corresponding to the second substrate having the second semiconductor chips.

Here, a fixing member may be installed on an inside of the slot, the fixing member fixing the second substrate by supporting upper and lower surfaces of the second substrate.

The main board substrate may have a penetration hole through which the other end of the lead frame is insertedly penetrated, and the main board substrate may be combined with the other end of the lead frame penetrating through the penetration hole by soldering.

The first semiconductor chip and the second semiconductor chip may be a power device and a control device, respectively.

The first substrate may be a metal substrate having an anodized layer, and the second substrate may be a printed circuit board (PCB).

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Power Module Package

Figure 1:
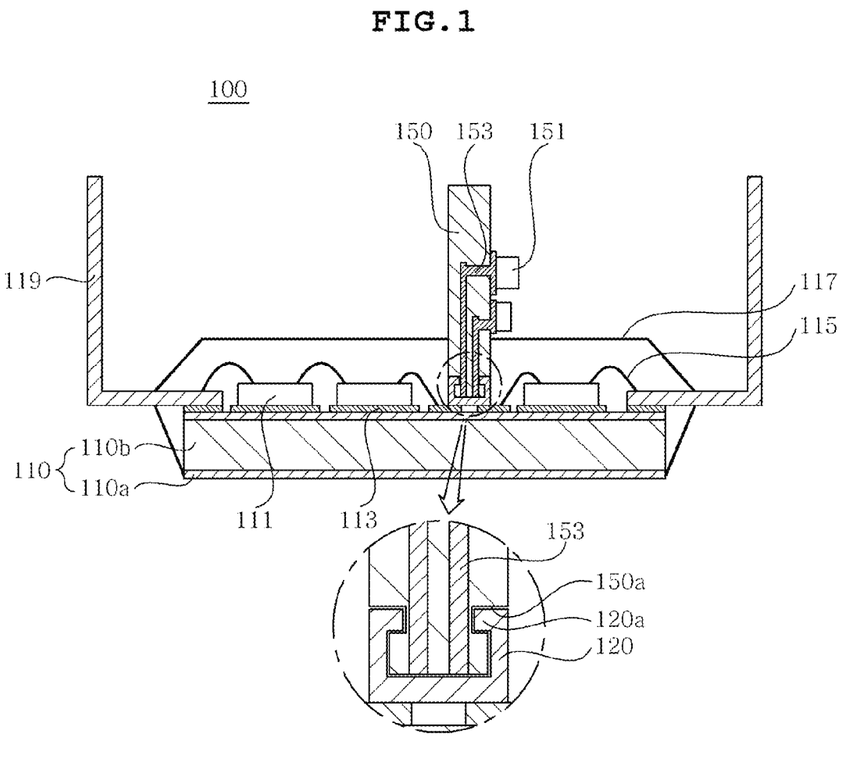
FIG. 1 is a cross sectional view showing a structure of a power module package according to one preferred embodiment of the present invention.
Figure 2:
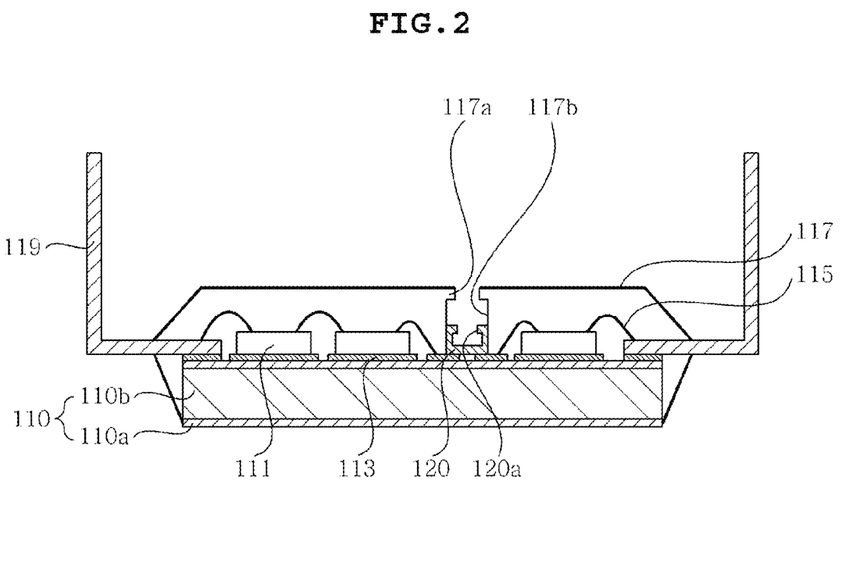
FIG. 2 is a cross sectional view showing a structure of a first substrate in the power module package according to one preferred embodiment of the present invention.
Figure 3:
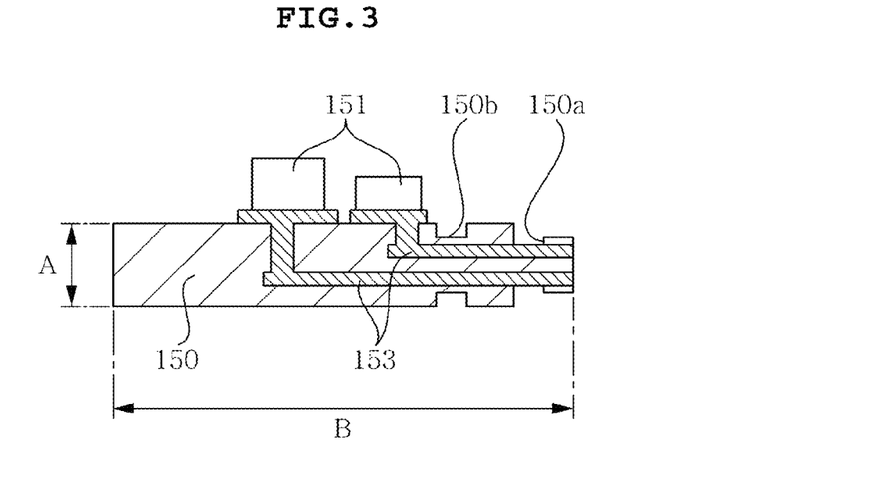
FIG. 3 is a cross sectional view showing a structure of a second substrate in the power module package according to one preferred embodiment of the present invention.
Figure 4:
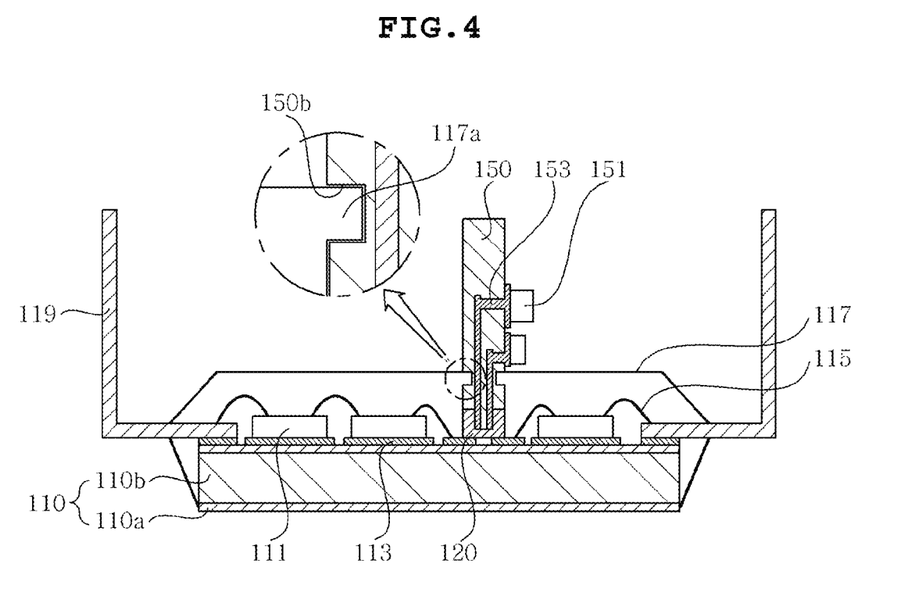
FIG. 4 is a cross sectional view showing a structure of a power module package according to another preferred embodiment of the present invention.

FIG. 1 is a cross sectional view showing a structure of a power module package according to one preferred embodiment of the present invention; FIG. 2 is a cross sectional view showing a structure of a first substrate in the power module package according to one preferred embodiment of the present invention; FIG. 3 is a cross sectional view showing a structure of a second substrate in the power module package according to one preferred embodiment of the present invention; and FIG. 4 is a cross sectional view showing a structure of a power module package according to another preferred embodiment of the present invention.

Referring to FIG. 1, a power module package according to the present preferred embodiment may include a first substrate 110, a second substrate 150, a sealing resin (117), and a lead frame (119).

In the present preferred embodiment, first semiconductor chips 111 may be mounted on the first substrate 110.

In the present preferred embodiment, the first substrate 110 may be a metal substrate 110b having an anodized layer 110a, but is not limited thereto. Examples of the first substrate 110 may include a printed circuit board (PCB), a ceramic substrate, and a direct bonded copper (DBC) substrate.

As the metal substrate 110b, for example, a metal material that can be available at a relatively low cost as well as aluminum (Al) or aluminum alloy having very superior heat transfer property may be used. The metal substrate 110b has superior heat transfer property, and thus functions as a heat radiating member radiating the heat from the first semiconductor chips 111. Hence, a separate heat radiating member is not needed.

In addition, the anodised layer 110a is formed by immersing the metal substrate 110b made of aluminum or aluminum alloy in an electrolytic liquid, such as boric acid, phosphoric acid, sulfuric acid, chromic acid, and the other, and then applying a positive voltage to the metal substrate 110b and a negative voltage to the electrolytic liquid. The thus formed anodized layer has an insulating performance and a relatively high heat transfer property of about 10-30W/km.

In the present preferred embodiment, since aluminum or aluminum alloy is used for the metal substrate 110b, an aluminum anodized layer ($Al_2O_3$) may be formed.

The anodized layer 110a has an insulating property to thereby allow a circuit layer to be formed on the first substrate 110. In addition, the anodized layer 110a may be formed in a smaller thickness than general insulating layers, so that the distance between the metal substrate 110b and the first semiconductor chips 111 can be reduced, thereby further improving heat radiation performance of the module and making the module thinner.

Meanwhile, in the present preferred embodiment, a first wiring pattern 113 is formed on the first substrate 110 and connected to the first semiconductor chips 111 through wire bonding.

The first wiring pattern 113 may be formed by a conventional method, for example, chemical vapor deposition (CVD), physical vapor deposition (PVD), or electroplating or electroless plating.

In addition, the first wiring pattern 113 may include a conductive material such as a metal, for example, aluminum, aluminum alloy, copper, copper alloy, or a combination thereof, nickel, gold, or an alloy thereof, but is not limited thereto.

In the present preferred embodiment, silicon controlled rectifiers (SCRs), power transistors, insulated gate bipolar transistors (IGBTs), MOS transistors, power rectifiers, power regulators, inverters, converters, or high power semiconductor chips made of combination thereof, or diodes may be used for the first semiconductor chip 111.

Here, although not shown in FIG. 2, the first semiconductor chips 111 may be attached on the first wiring pattern 113 by using an adhesive member (not shown), and the adhesive member (not shown) may be conductive or non-conductive.

For example, the adhesive member may be formed by plating, or may be a conductive paste or a conductive tape. Also, the adhesive member may be a solder, metal epoxy, a metal paste, resin-based epoxy, or an adhesive tape having excellent heat resistance.

For example, a high-temperature tape, such as, a glass tape, a silicon tape, a Teflon tape, a stainless foil tape, a ceramic tape, or the like, which is commercialized and known, may be used as the adhesive tape usable as the adhesive member, and the adhesive member may be formed by combining the above-described materials, but is not particularly limited thereto.

In the present preferred embodiment, the first semiconductor chips 111 mounted on the first wiring pattern 113, as shown in FIG. 2, may be electrically connected to the first wiring pattern 113 through bonding of wires 115. Meanwhile, they may be connected by flip chip bonding instead of using the wires 115.

Here, a process of connecting the first semiconductor chips 111 and the first wiring pattern 113 by using the wires 115 may be performed by ball bonding, wedge bonding, or stitch bonding, which is well known in the art.

In the present preferred embodiment, a coupling unit 120 for coupling the first substrate 110 and the second substrate 150 may be provided on the first substrate 110 while the coupling unit 120 is electrically connected to the first semiconductor chips 111.

The coupling unit 120 may be attached on the first wiring pattern 113 formed on the first substrate 110. The coupling unit 120 may be electrically connected to the first semiconductor chips 111 and the first wiring pattern 113 through bonding of wires 115, like the first semiconductor chip 111, and the connecting may be performed by flip chip bonding.

Here, the coupling unit 120 may have at least one coupling groove (not shown) for coupling with the second substrate 150, and a coupling pin corresponding to the coupling groove (not shown) is preferably formed on one end in a length direction of the second substrate 150 coupled therewith.

The shapes of the coupling groove and the coupling pin may have, without being particularly limited to, for example, commercialized female connector and male connector type, or socket and pin type, so that coupling and uncoupling can be easily performed.

In the present preferred embodiment, as shown in FIG. 2, first catching protrusions 120a facing each other may be formed on an upper portion of an inside of the coupling unit 120.

This unit is for preventing the second substrate 150 from deviating from the coupling unit 120. Preferably, first catching groove 150a corresponding to the first catching protrusions 120a, as shown in FIG. 3, are formed in upper and lower portions of an end in a length direction of the second substrate 150.

That is, when the second substrate 150 is installed at the coupling unit 120, the first catching protrusions 120a are caught in the first catching grooves (150a), thereby preventing the second substrate 150 from deviating from the coupling unit 120, as shown in FIG. 1. Here, the first catching protrusion 120a may be made of an elastic member in order to prevent the second substrate 150 from being damaged at the time of coupling.

Also, the first catching protrusions 120a and the first catching grooves 150a may be respectively formed on the second substrate 150 and the coupling unit 120, on the contrary to the above description.

In the present preferred embodiment, second semiconductor chips 151 may be mounted on the second substrate 150. In addition, the second substrate 150 may be a printed circuit board (PCB).

In the present preferred embodiment, as shown in FIG. 1, the second substrate 150 is coupled with the first substrate 110 such that a side surface in a thickness direction of the second substrate 150 is disposed on an upper surface of the first substrate 110.

Here, the thickness direction refers to Portion A in a cross section of the second substrate 150 shown in FIG. 3, and the length direction refers to Portion B.

In addition, the side surface means a surface except upper and lower surfaces of the substrate on which components are conventionally mounted.

That is, the second substrate 150 is vertically erected to cross the first substrate 110 at a right angle such that the side surface in the thickness direction (A) of the second substrate 150 shown in FIG. 3 is positioned at the first substrate 110 in an up-down direction.

Here, the coupling pin (not shown) may be formed on one end in the length direction (B) of the second substrate 150 such that the coupling unit 120 having the above described coupling groove (not shown) can be coupled with the coupling pin (not shown).

In addition, in the present preferred embodiment, the first catching grooves 150a and the second catching grooves 150b corresponding to the first catching protrusions 120a and the second catching protrusions 117a are formed on upper and lower portions of one end in the length direction (B) of the second substrate 150, so that the first catching protrusions 120a are caught in the first catching grooves 150a and the second catching protrusions 117a are caught in the second catching grooves 150b, respectively, when the second substrate 150 is coupled with the first substrate 110, thereby preventing the second substrate 150 from deviating from the first substrate 110.

Here, the first catching protrusion 120a and the second catching protrusion 117a may be made of an elastic member in order to prevent the second substrate 150 from being damaged at the time of coupling.

In addition, on the contrary to the above, the catching protrusions may be formed on upper and lower portions of one end in the length direction (B) of the second substrate 150, the catching grooves corresponding to the catching protrusions may be formed in the coupling unit 120 and an upper portion of an inside of an insertion groove 117b of the coupling unit 120 and the sealing resin 117.

In addition, the first catching protrusions 120a and the first catching grooves 150a as well as the second catching protrusions 117a and the second catching grooves 150b may be formed simultaneously, or only one of both may be formed.

In addition, a second wiring pattern 153 connected to the second semiconductor chips 151 may be also formed in the second substrate 150.

The second wiring pattern 153 may be formed by the method, which is the same as the forming method of the first wiring pattern 113. The second wiring pattern 153 may include a conductive material, such as a metal, for example, aluminum, aluminum alloy, copper, copper alloy, or a combination thereof, nickel, gold, or an alloy thereof, but is not limited thereto.

In addition, the second semiconductor chips 151 may be connected to the second wiring pattern 153 by flip chip bonding or wire bonding.

In the present preferred embodiment, examples of the second semiconductor chip 151 may include a low-power semiconductor chip for controlling the above-described high-power semiconductor chip, for example, a control device for controlling the power device.

That is, the second substrate 150, on which the low-power semiconductor chips that are thermally/electrically vulnerable as compared with the high-power semiconductor chips are mounted, and the first substrate 110, on which the high-power semiconductors are mounted, are manufactured separately from each other and coupled with each other in a three-dimensional structure, thereby preventing the effects by heat generated from the high-power semiconductor chips from influencing the low-power semiconductor chips.

In addition, as described above, the first substrate 110 and the second substrate 150 are easily coupled with each other or uncoupled from each other by using the coupling units such as connectors or sockets, thereby facilitating the exchange of the second substrate 150 on which the low-power semiconductor chips having a relatively frequent breakdown are mounted.

In addition, in the present preferred embodiment may further include the sealing resin 117 wrapping the side surface and the upper surface of the first substrate 110.

The sealing resin 117 is for protecting the first semiconductor chips 111 including the wires 115 from the outside. For example, epoxy molding compound (EMC) or the like may be used for the sealing resin 117, but is not particularly limited thereto.

In the present preferred embodiment, the sealing resin 117 may have an insertion groove 117b into which the second substrate 150 is inserted. The coupling unit 120 with which the second substrate 150 is coupled may be exposed through the insertion groove 117b. The second catching protrusions 117a may be formed at an upper portion of an inside of the insertion groove 117b, as shown in FIG. 2.

The second catching protrusions 117a are also for preventing deviation of the coupled second substrate 150, like the first catching protrusions 120a, and the second catching grooves 150b corresponding to these are also preferably formed at upper and lower portions of one end in a length direction (B) of the second substrate 150, as shown in FIG. 3.

In addition, the power module package according to the present embodiment, as shown in FIG. 1, may further include a lead frame 119 having one end buried in the sealing resin 117 and electrically connected to the first substrate 110 and the other end protruded out of the sealing resin 117.

Here, the lead frame 119 may be generally formed of copper having high heat conductivity, but is not limited thereto.

System Module Having Power Module Package

Figure 5:
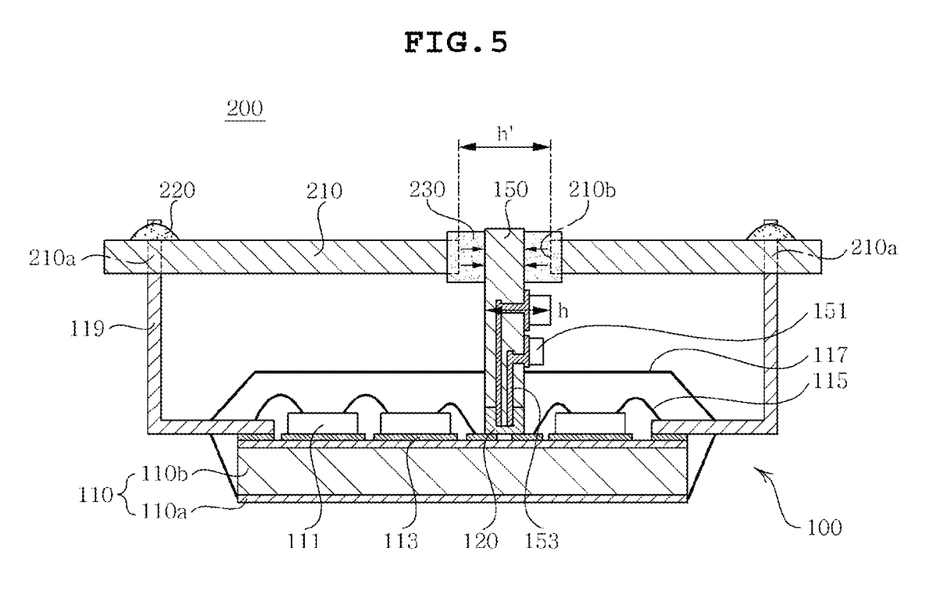
FIG. 5 is a cross sectional view showing a structure of a system module having the power module package according to one preferred embodiment of the present invention.

FIG. 5 is a cross sectional view showing a structure of a system module having the power module package according to one preferred embodiment of the present invention.

Referring to FIG. 5, a system module 200 according to the present preferred embodiment may include a main board substrate 210 and a power module package 100 mounted thereon.

The main board substrate 210 may be a printed circuit board (PCB), but is not particularly limited thereto.

In addition, passive devices (not shown), such as capacitors, registers, or the like, as well as the power module package 100 may be disposed on the main board substrate 210.

The power module package 100 may include a first substrate 110 on which first semiconductor chips 111 are mounted, a second substrate 150 on which second semiconductor chips 151 are mounted, and a lead frame 119 having one end connected to the first substrate 110 and the other end protruded to the outside.

Here, the other end of the lead frame 119 protruded to the outside may be combined to the main board substrate 210, as shown in FIG. 5.

Here, the other end of the lead frame 119 is protruded onto the main board substrate 210, penetrating through a penetration hole 210a formed in the main board substrate 210, and the other end of the lead frame 119 that is protruded and the main board substrate 210 are bonded by using a solder 220, so that the power module package 100 can be combined with the main board substrate 210.

The first substrate 110 may be a metal substrate 110b having an anodized layer 110a, but is not limited thereto. Examples of the first substrate 110 may include a printed circuit board (PCB), a ceramic substrate, a direct bonded copper (DBC) substrate.

As the metal substrate 110b, for example, a metal material that can be available at a relatively low cost as well as aluminum (Al) or aluminum alloy having superior heat transfer property may be used. The anodized layer 110a may be an aluminum anodized layer ($Al_2O_3$).

In addition, the second substrate 150 may be a printed circuit board (PCB).

In the present preferred embodiment, the second substrate 150 is coupled with the first substrate 110 such that a side surface in a thickness direction (A) of the second substrate 150 is disposed on an upper surface of the first substrate 110.

Here, the thickness direction refers to Portion A in a cross section of the second substrate 150 shown in FIG. 3, and the length direction refers to Portion B.

In addition, the side surface means a surface except upper and lower surfaces of the substrate on which components are conventionally mounted.

That is, the second substrate 150 is vertically erected to cross the first substrate 110 at a right angle such that the side surface in the thickness direction (A) of the second substrate 150 shown in FIG. 3 is positioned at the first substrate 110 in an up-down direction.

In addition, the power module package 100 according to the present preferred embodiment may further include a coupling unit 120 for coupling the first substrate 110 and the second substrate 150. The coupling unit 120 may include at least one coupling groove (not shown) formed on the first substrate 110. In addition, a coupling pin (not shown) corresponding to the coupling groove (not shown) may be formed on one end in the length direction (B) of the second substrate 150 coupled therewith.

The shapes of the coupling groove (not shown) and the coupling pin (not shown) may have, without being particularly limited to, for example, commercialized female connector and male connector type, or socket and pin type, so that coupling and uncoupling can be easily performed.

Here, the first semiconductor chip 111 and the second semiconductor chip 151 each may be a silicon controlled rectifier (SCR), a power transistor, an insulated gate bipolar transistor (IGBT), a MOS transistor, a power rectifier, a power regulator, an inverter, a converter, or a high power semiconductor chip made of combination thereof, or a diode.

That is, the second substrate 150, on which the low-power semiconductor chips that are thermally/electrically vulnerable as compared with the high-power semiconductor chips are mounted, and the first substrate 110, on which the high-power semiconductors are mounted, are manufactured separately from each other, and then coupled with each other in a three-dimensional structure, thereby preventing the effects of heat generated from the high-power semiconductor chips from influencing the low-power semiconductor chips.

In addition, as described above, the first substrate 110 and the second substrate 150 are easily coupled with each other by using the coupling units such as connectors or sockets, thereby facilitating the exchange of the second substrate 150 on which the low-power semiconductor chips having a relatively frequent breakdown are mounted.

In the present preferred embodiment, a slot 210b penetrating through the end of the second substrate 150 coupled with the first substrate 110 may be formed in the main board substrate 200 as above.

Here, the slot 210b is prepared in order to exchange the second substrate 150 on which the low-power semiconductor chips 151 having a relatively frequent breakdown are mounted, after the power module package 100 is installed on the main board substrate 200. As shown in FIG. 5, the width (h') of the slot 210b may be equal to or larger than the height (h) of the second substrate 150 including the second semiconductor chip 151. That is, the slot 210b has such a width (h')

that the second substrate 150 on which the semiconductor chips 151 are mounted can penetrate through the slot 210b.

Here, as shown in FIG. 5, a fixing member 230 may be installed at an inside of the slot 210b, so that the fixing member 230 supports the upper and lower surfaces of the second substrate 150 to fix the second substrate 150.

That is, the fixing member 230 supports the second substrate 150 in an arrow direction, thereby preventing the second substrate 150 coupled with the first substrate 110 from wobbling from side to side, and maintaining the coupling state of the first substrate 110 and the second substrate 150.

Here, the fixing member 230 may be installed at an inside of the slot 210b formed in the main board substrate 200, after the power module package 100 and the main board substrate 200 are coupled with each other. Also, after the fixing member 230 is first detached at the time of exchanging of the second substrate 150 and then the second substrate 150 may be exchanged, the fixing member 230 may be again installed.

As set forth above, according to the present invention, only the control device can be selectively exchanged when the control device is broken down, thereby allowing easy repair and a reduction in repair costs when the power module is broken down.

Further, according to the present invention, the power device generating high heat and the control device vulnerable to heat are arranged in a three-dimensional structure, thereby minimizing the effects of heat on the control device and thus improving reliability of the module and lifespan characteristics of the module.

Further, according to the present invention, the freedom of circuit design can be increased due to three-dimensional arrangement of the power device and the control device, thereby allowing implementation of various additional elements.

Further, according to the present invention, miniaturization of the module can be achieved by vertically disposing the control circuit board on which the control device is mounted in the module.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package, comprising:
   a first substrate having first semiconductor chips mounted thereon; and
   a second substrate having second semiconductor chips mounted thereon, the second substrate being vertically coupled with the first substrate such that a side surface in a thickness direction of the second substrate is disposed on an upper surface of the first substrate,
   wherein the first substrate further comprises a coupling unit electrically connected to the first semiconductor chips and coupled with the second substrate,
   wherein the power module package further comprises a sealing resin having an insertion groove and wrapping the side surface and the upper surface of the first substrate,
   wherein the insertion groove exposes the coupling unit therethrough and part of the second substrate is inserted into the insertion groove,
   wherein the second substrate is detachably coupled with the first substrate by the coupling unit through the insertion groove,
   wherein first catching protrusions facing each other are formed on an upper portion of an inside of the coupling unit,
   wherein first catching grooves corresponding to the first catching protrusions are formed in upper and lower portions of one end in a length direction of the second substrate,
   wherein second catching protrusions facing each other are formed on an upper portion of an inside of the insertion groove, and
   wherein second catching grooves corresponding to the second catching protrusions are formed in upper and lower portions of one end in a length direction of the second substrate.

2. The power module package as set forth in claim 1, further comprising a lead frame having one end buried in the sealing resin and connected to the first substrate and the other end protruded out of the sealing resin.

3. The power module package as set forth in claim 1, wherein the first semiconductor chip and the second semiconductor chip are a power device and a control device, respectively.

4. The power module package as set forth in claim 1, wherein the first substrate is a metal substrate having an anodized layer.

5. The power module package as set forth in claim 4, wherein the metal substrate is made of aluminum (Al).

6. The power module package as set forth in claim 1, wherein the second substrate is a printed circuit board (PCB).

7. A system module, comprising:
   a power module package including a first substrate having first semiconductor chips mounted thereon, a second substrate having second semiconductor chips mounted thereon, the second substrate being vertically coupled with the first substrate such that a side surface in a thickness direction of the second substrate is disposed on an upper surface of the first substrate, and a lead frame having one end connected to the first substrate and the other end protruded to the outside; and
   a main board substrate coupled with the other end of the lead frame protruded to the outside to allow the power module package to be installed thereon, the main board substrate having a slot with a size corresponding to the second substrate having the second semiconductor chips,
   wherein the first substrate further comprises a coupling unit electrically connected to the first semiconductor chips and coupled with the second substrate,
   wherein the power module package further comprises a sealing resin having an insertion groove and wrapping the side surface and the upper surface of the first substrate,
   wherein the insertion groove exposes the coupling unit therethrough and part of the second substrate is inserted into the insertion groove,
   wherein the second substrate is detachably coupled with the first substrate by the coupling unit through the insertion groove,
   wherein first catching protrusions facing each other are formed on an upper portion of an inside of the coupling unit, wherein first catching grooves corresponding to the first catching protrusions are formed in upper and lower portions of one end in a length direction of the second substrate, wherein second catching protrusions facing each other are formed on an upper portion of an inside of the insertion groove, and wherein second catching grooves corresponding to the second catching protrusions are formed in upper and lower portions of one end in a length direction of the second substrate.

8. The system module as set forth in claim 7, wherein a fixing member is installed on an inside of the slot, the fixing member fixing the second substrate by supporting upper and lower surfaces of the second substrate.

9. The system module as set forth in claim 7, wherein the main board substrate has a penetration hole through which the other end of the lead frame is inserted.

10. The system module as set forth in claim 9, wherein the main board substrate is combined with the other end of the lead frame penetrating through the penetration hole by soldering.

11. The system module as set forth in claim 7, wherein the first semiconductor chip and the second semiconductor chip are a power device and a control device, respectively.

12. The system module as set forth in claim 7, wherein the first substrate is a metal substrate having an anodized layer.

13. The system module as set forth in claim 7, wherein the second substrate is a printed circuit board (PCB).

* * * * *